United States Patent
Heo et al.

(10) Patent No.: US 8,564,968 B1
(45) Date of Patent: Oct. 22, 2013

(54) AIR CAVITY PACKAGE INCLUDING A PACKAGE LID HAVING AT LEAST ONE PROTRUSION CONFIGURED TO FACILITATE COUPLING OF THE PACKAGE LID WITH A PACKAGE WALL

(75) Inventors: Youngwook Heo, Dallas, TX (US); John M. Beall, Richardson, TX (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 146 days.

(21) Appl. No.: 13/104,770

(22) Filed: May 10, 2011

(51) Int. Cl.
- *H05K 7/10* (2006.01)
- *H05K 7/00* (2006.01)
- *H05K 7/12* (2006.01)
- *H05K 1/11* (2006.01)

(52) U.S. Cl.
USPC ........... 361/767; 361/760; 361/768; 361/777; 361/770; 361/804

(58) Field of Classification Search
USPC .......... 361/783, 760, 767, 768, 777, 770, 804
See application file for complete search history.

(56) References Cited

U.S. PATENT DOCUMENTS

| | | | | |
|---|---|---|---|---|
| 5,616,421 A | * | 4/1997 | Sawtell et al. | 428/614 |
| 6,511,866 B1 | | 1/2003 | Bregante | |
| 6,632,997 B2 | * | 10/2003 | Hoffman et al. | 174/527 |
| 6,660,562 B2 | * | 12/2003 | Lee | 438/112 |
| 7,410,836 B2 | * | 8/2008 | Huang | 438/124 |
| 2008/0272475 A1 | * | 11/2008 | Dijkstra et al. | 257/682 |
| 2010/0123228 A1 | * | 5/2010 | Bartlow et al. | 257/676 |

FOREIGN PATENT DOCUMENTS

WO 2007052198 5/2007

* cited by examiner

*Primary Examiner* — Hoa C Nguyen
*Assistant Examiner* — Binh Tran
(74) *Attorney, Agent, or Firm* — Schwabe, Williamson & Wyatt, P.C.

(57) ABSTRACT

Embodiments include but are not limited to apparatuses and systems including a die package including a substrate, a die coupled with a top surface of the substrate, a package wall disposed on the top surface of the substrate and bounding the die, and a package lid coupled with the package wall, and including at least one protrusion facilitating a coupling of the package lid with the package wall. At least one edge of the top surface of the die pad may include an etched portion such that a width of the top surface is narrower than a width of the bottom surface. At least one edge of a top surface of at least one of the leads may include an etched portion such that a width of the top surface is narrower than a width of the bottom surface. Other embodiments may be described and claimed.

22 Claims, 14 Drawing Sheets

AIR CAVITY PACKAGE INCLUDING A PACKAGE LID HAVING AT LEAST ONE PROTRUSION CONFIGURED TO FACILITATE COUPLING OF THE PACKAGE LID WITH A PACKAGE WALL

TECHNICAL FIELD

Embodiments of the present invention relate generally to apparatuses and systems including a package lid including at least one protrusion configured to facilitate a coupling of the package lid with a package wall, to a die pad including at least one edge of the top surface of the die pad including an etched portion such that a width of the top surface is narrower than a width of the bottom surface of the die pad, or leads including at least one edge of a top surface of at least one of the leads including an etched portion such that a width of the top surface is narrower than a width of the bottom surface of the lead.

BACKGROUND

Dies for high-frequency products are sometimes packaged within overmolded quad-flat no-lead (QFN) packages. QFN packages, however, may cause degradation in performance for high-frequency products. Air cavity packages, on the other hand, may improve the overall performance due at least in part to air having a lower dielectric constant than the plastic of the overmolded QFN packages.

While air cavity packages may offer a performance improvement over overmolded QFN packages, the cost for manufacturing air cavity packages may be high relative to the manufacturing costs of other types of packages. Some air cavity packages, for instance, may be prone to delamination at the package lid seal. Moreover, probe testing of the die pad of the air cavity packages may cause the die pad to lift and separate, at least in part, from remaining parts of the leadframe, resulting in vapor or fluid leakage through the metal-plastic interfaces at the lead surfaces.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

Figure 1:
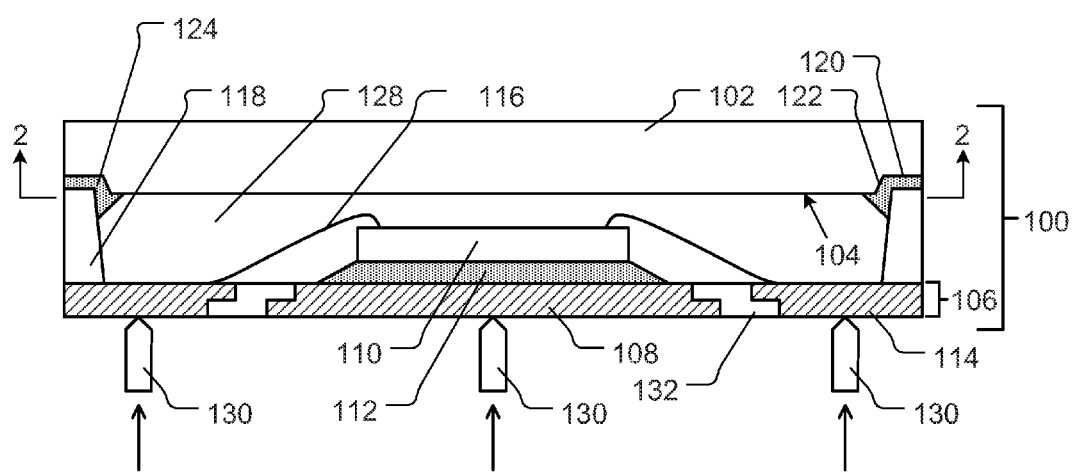
FIG. 1 is a cross-sectional side view of a package including a package lid having a protrusion in a center portion of the package lid, and a substrate including a pyramid-shaped die pad, all in accordance with various embodiments.

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent. Moreover, some embodiments may include more or fewer operations than may be described.

The description may use the phrases "in an embodiment," "in embodiments," "in some embodiments," or "in various embodiments," which may each refer to one or more of the same or different embodiments. Furthermore, the terms "comprising," "including," "having," and the like, as used with respect to embodiments of the present invention, are synonymous.

As used herein, "coupled," along with its derivatives, may mean one or more of the following. "Coupled" may mean a direct physical or electrical coupling or connection, wherein there is no other element coupled or connected between the elements that are said to be coupled with each other. "Coupled" may also mean an indirect physical or electrical coupling or connection, where one or more other elements are coupled or connected between the elements that are said to be coupled with each other.

The description may use perspective-based descriptions such as up/down, back/front, and top/bottom. Such descriptions are merely used to facilitate the discussion and are not intended to restrict the application of embodiments of the present invention.

For the purposes of the present disclosure, the phrase "A/B" means A or B. The phrase "A and/or B" means (A), (B), or (A and B). The phrase "at least one of A, B, and C" means (A), (B), (C), (A and B), (A and C), (B and C), or (A, B and C). The phrase "(A)B" means (B) or (A and B), that is, A is an optional element. In addition, although embodiments of the present disclosure may be shown and described as including a particular number of components or elements, embodiments are not limited to any particular number of components or elements.

This disclosure is generally drawn, inter alia, to air cavity packages. Embodiments include, but are not limited to, packages including a package wall disposed on a top surface of the substrate and bounding a die, and a package lid coupled with the package wall, and including at least one protrusion configured to facilitate a coupling of the package lid with the package wall. Embodiments also include, but are not limited to, a substrate including a die pad having a top surface configured to couple with a die, and a bottom surface opposite the top surface, wherein the die pad has a pyramid shape such that the top surface of the die pad has an area that is smaller than an area of the bottom surface.

FIG. 1 is a cross-sectional side view of a package 100 including a package lid 102 having a protrusion 104 in a center portion of the package lid 102, and a substrate 106 including a pyramid-shaped die pad 108, all in accordance with various embodiments.

The package 100 may include a die 110 coupled with a top surface of the substrate 106. The die 110 may be coupled with the substrate 106 by a suitable adhesive 112. As the die pad 108 may be a ground pad for the package 100, in various embodiments, the adhesive 112 may comprise a conductive adhesive material to provide an electrical pathway between the die 110 and the die pad 108 of the substrate 106. The die pad 108 may also provide heat dissipation for the package 100.

The substrate 106 may comprise a leadframe including the die pad 108 and a plurality of leads 114 around the periphery of the die pad 108 as illustrated. The die pad 108 and the leads 114 may be electrically insulated from each other by an insulating material 132 or molding compound (e.g, liquid-crystal polymer, plastic, epoxy, etc.). In various embodiments, the leadframe 108/114 may comprise any suitable material including, for example, pre-plated nickel/palladium/gold. As illustrated, the package 100 may be a quad-flat no-lead (QFN) package, and thus, the leadframe may be a suitable structure for use in manufacturing a QFN package. In various embodiments, other package types, and thus, leadframe types, may be enlisted.

Various electrical connections may be provided between the die 110 and the leads 114 by wires 116, and the leads 114 may provide electrical access to the die 110.

A package wall 118 and the package lid 102 in combination may be configured to enclose the die within the package 100 as illustrated. To that end, the package wall 118 may be disposed on the top surface of the substrate 106 and bounding the die 110 as illustrated.

The package wall 118 may have a tapered shape as illustrated. In various other embodiments, the package wall 118 may have any other suitable shape including, for example, rectangular. The tapered shape, however, may allow for ease of ejection from the mold used for forming the package wall 118. Although the angle of the taper of the package wall 118 may depend on the particular application, in various embodiments, the package wall 118 may have a taper of 3 degrees, or more than 3 degrees.

Figure 2:
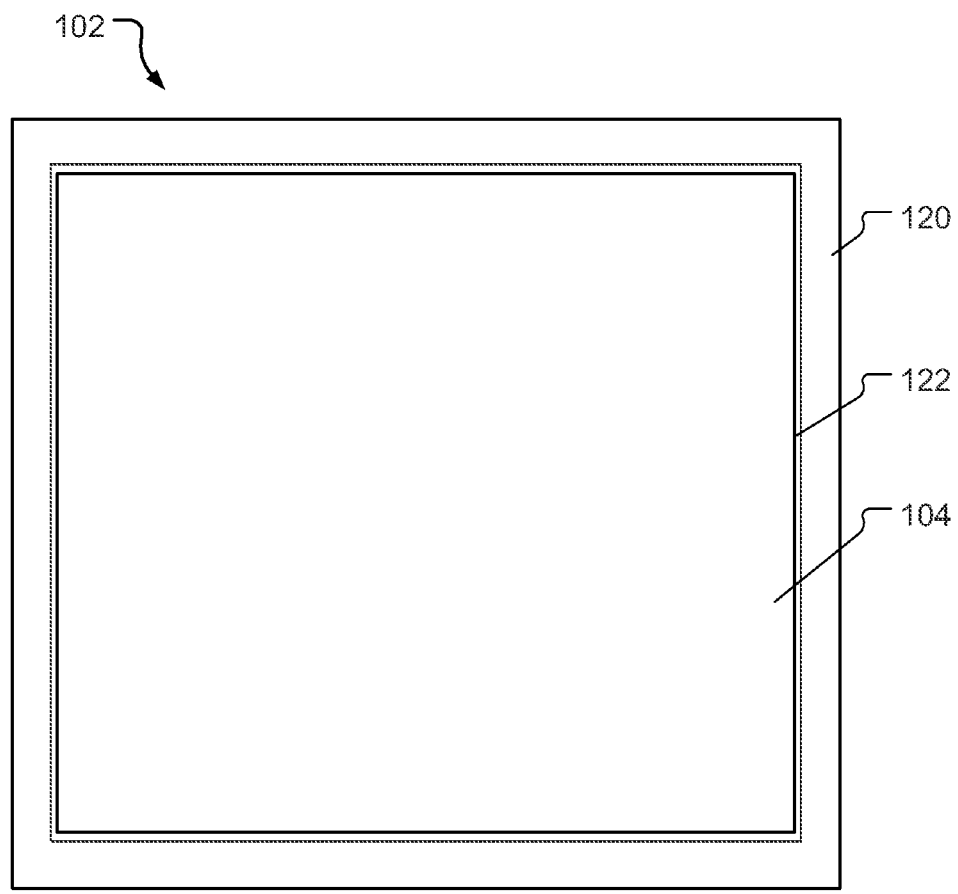
FIG. 2 is a bottom elevation view of the package lid of FIG. 1 taken along line 2-2.

The at least one protrusion 104 of the package lid 102 may be configured to facilitate a coupling of the package lid 102 with the package wall 118. To that end, the protrusion 104 may be configured to be disposed within the package wall 118 as illustrated. FIG. 2 is a bottom elevation view of the package lid 102 of FIG. 1 taken along line 2-2. As illustrated, the protrusion 104 may be disposed in a center portion of the package lid 102, and defined by a groove 120 disposed along a periphery of the package lid 102. The rise 122 may be tapered, as illustrated, or may have another shape (e.g., perpendicular). As with the tapered package wall 118, the tapered rise 122 may allow for ease of ejection from the mold used for forming the package lid 102.

The package wall 118 and the package lid 102 may be coupled by a suitable adhesive material 124. While any number of adhesives may be suitable, in various embodiments, the adhesive material 124 may comprise an epoxy, a resin, an acrylic, or a silicone.

Figure 3:
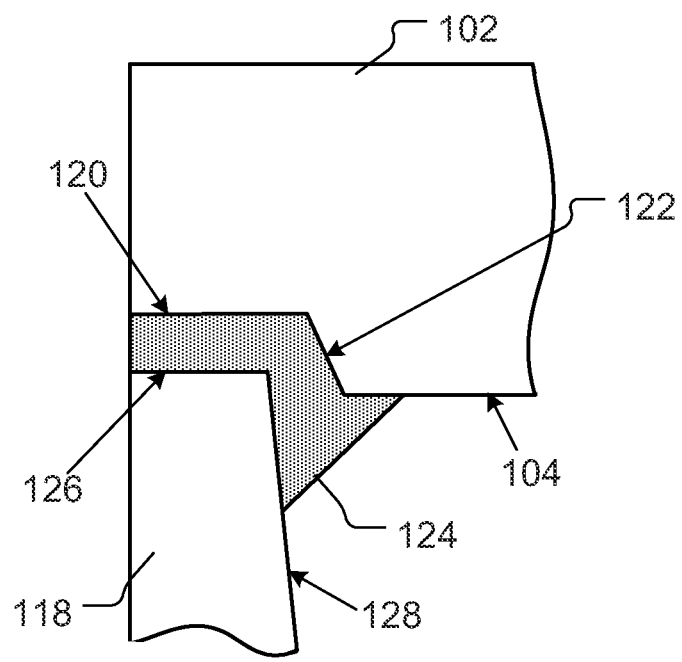
FIG. 3 is a fragmentary cross-sectional view of the package lid and package wall of FIG. 1.

Providing the package lid 102 with at least one protrusion 104 may result in robust lid attachment and bonding, thereby allowing the package 100 to resist mechanical stress. The protrusion 104 effectively increases the surface area of the package lid 102 (at least for the surface facing the die 110), which may allow for increased contact area for the adhesive material 124. For greater detail of the increased surface area, refer to FIG. 3. FIG. 3 is a fragmentary cross-sectional view of the package lid 102 and package wall 118 of FIG. 1, showing the groove 120, riser 122, and a portion of the protrusion 104 in contact with the adhesive material 124. In addition, a top surface 126 and a portion of the tapered wall 128 of the package wall 118 may also be in contact with the adhesive material 124.

Figure 4:
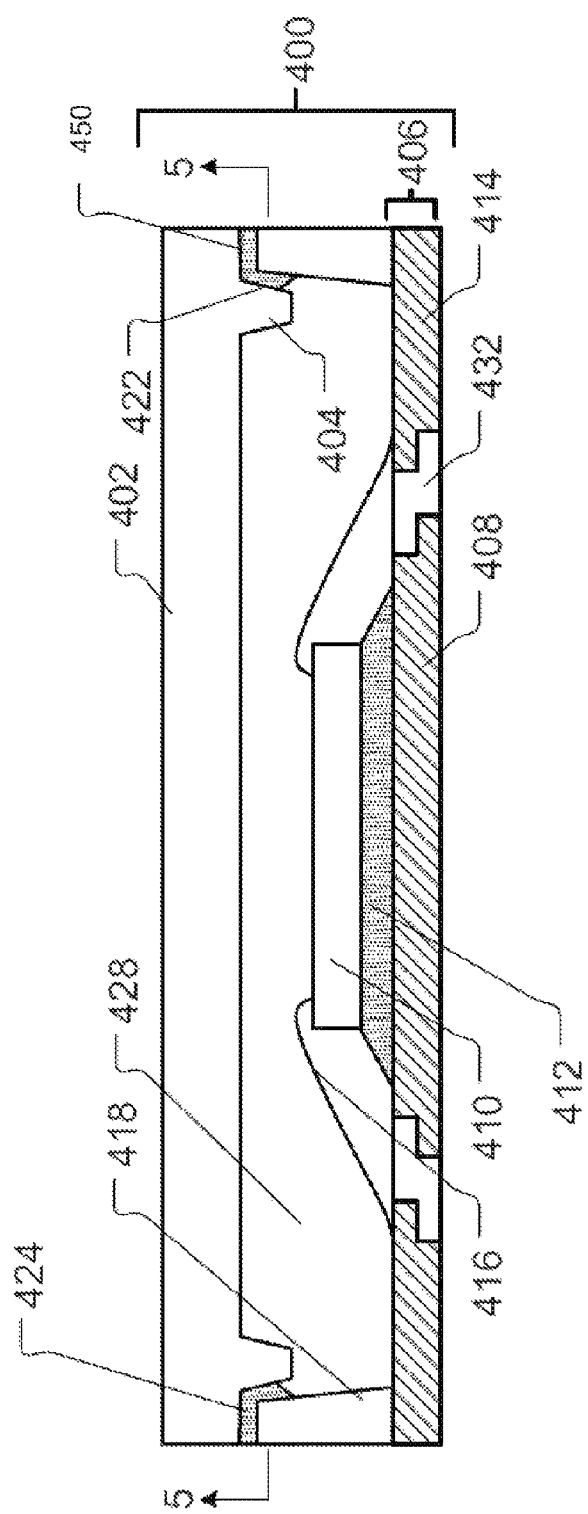
FIG. 4 is a cross-sectional side view of a package including a package lid having a rib near the periphery of the package lid, and a substrate including a pyramid-shaped die pad, all in accordance with various embodiments.
Figure 5:
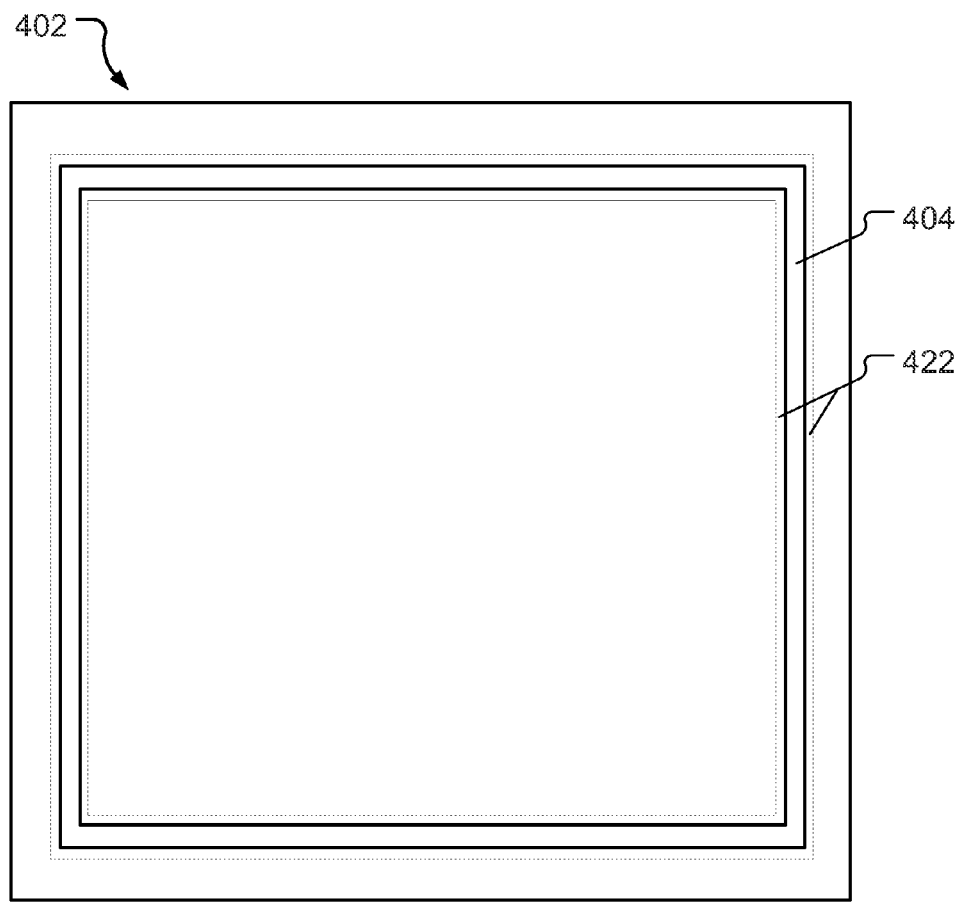
FIG. 5 is a bottom elevation view of the package lid of FIG. 4 taken along line 5-5.

In various embodiments, a protrusion of a lid may be formed in configurations other than as shown with respect to at least one protrusion 104. As illustrated in FIG. 4, for example, the package 400 may include at least one protrusion 404 comprising a rib disposed near a periphery 450 of a package lid 402. FIG. 5 is a bottom elevation view of the package lid 402 of FIG. 4 taken along line 5-5. Except for described differences with respect to the package lid 404, components of package 400 and package 100 may be similar to one another and substantially interchangeable.

As illustrated, the package 400 may include a substrate 406 including a pyramid-shaped die pad 408, and a die 410 coupled with a top surface of the substrate 406. The die 410 may be coupled with the substrate 406 by a suitable adhesive 412. The substrate 406 may comprise a leadframe including the die pad 408 and a plurality of leads 414 around the periphery of the die pad 408 as illustrated. The die pad 408 and the leads 414 may be electrically insulated from each other by an insulating material 432 (e.g, plastic, epoxy, etc.). Various electrical connections may be provided between the die 410 and the leads 414 by wires 416, and the leads 414 may provide electrical access to the die 410.

The protrusion 404 may be configured to fit within the package wall 418 as illustrated. A riser 422 may be tapered, as illustrated, or may have another shape (e.g., perpendicular). As with the tapered package wall 418, the tapered riser 422 may allow for ease of ejection from the mold used for forming the package lid 402.

Figure 6:
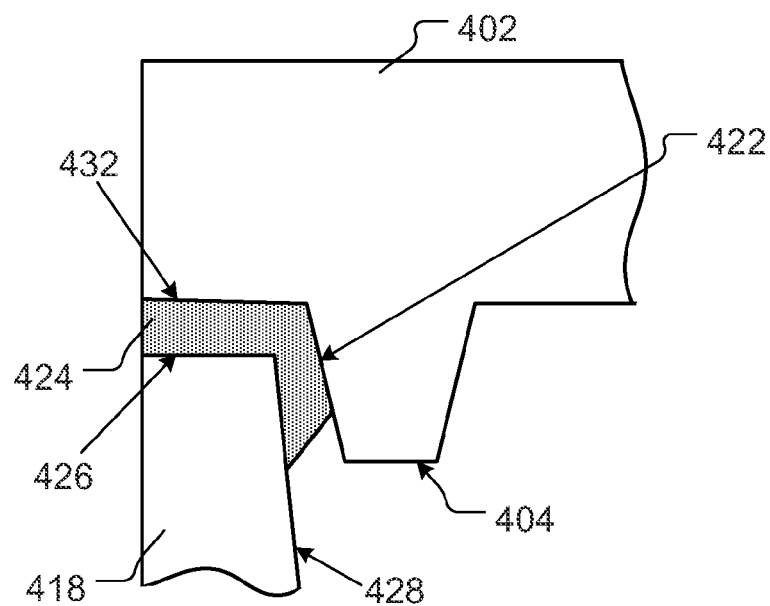
FIG. 6 is a fragmentary cross-sectional view of the package lid and package wall of FIG. 4.

Similar to that of package 100 of FIG. 1, providing the package lid 402 with at least one protrusion 404 may result in robust lid attachment and bonding, thereby allowing the package 400 to resist mechanical stress. The protrusion 404 effectively increases the surface area of the package lid 402 (at least for the surface facing die 410), which may allow for increased contact area for the adhesive material 424. For greater detail of the increased surface area, refer to FIG. 6, which shows the periphery 434, rise 422, and a portion of the protrusion 404 in contact with the adhesive material 424. In addition, the top surface 426 and a portion of the tapered wall 428 of the package wall 418 may also be in contact with the adhesive material 424.

Referring again to FIG. 1, with continued reference to FIG. 4, the packages 100, 400 may comprise an air cavity 128, 428. An air cavity 128, 428 may be advantageous in that air has a lower dielectric constant than that found for overmolding materials. Thus, utilizing the air cavity 128, 428 may result in a reduced dielectric loading as compared to an overmolded package. Nevertheless, in various embodiments, a package may instead comprise an overmolded package (not illustrated).

Figure 7:
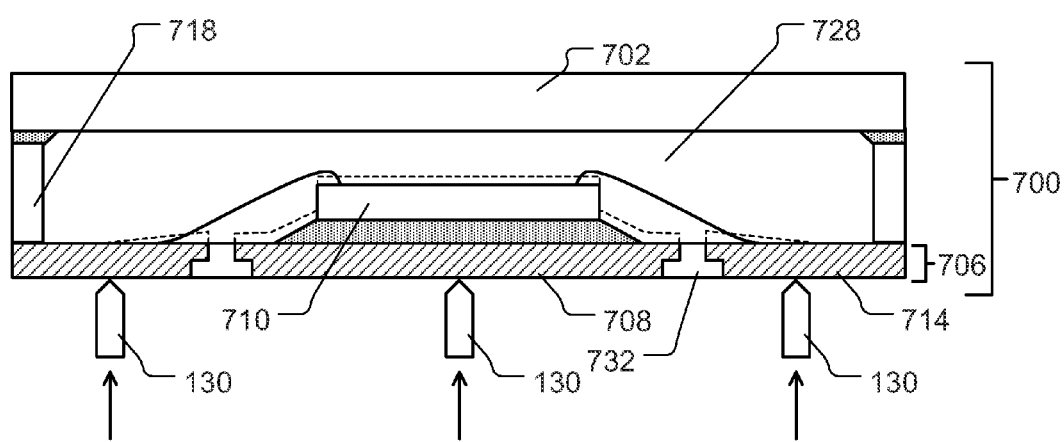
FIG. 7 is a related art package.

While the air cavity 128, 428 may provide benefits, certain challenges may arise through use of an air cavity. During test of the package 100, 400, a probe 130 may exert pressure onto various points of the substrate 106, 406. As the air cavity 128, 428 provides little, if any, counteracting force against the force of the probe 130, related art packages have been known to experience delamination at the metal-plastic interfaces of the substrate, as illustrated for the related-art package 700 of FIG. 7.

Figure 8:
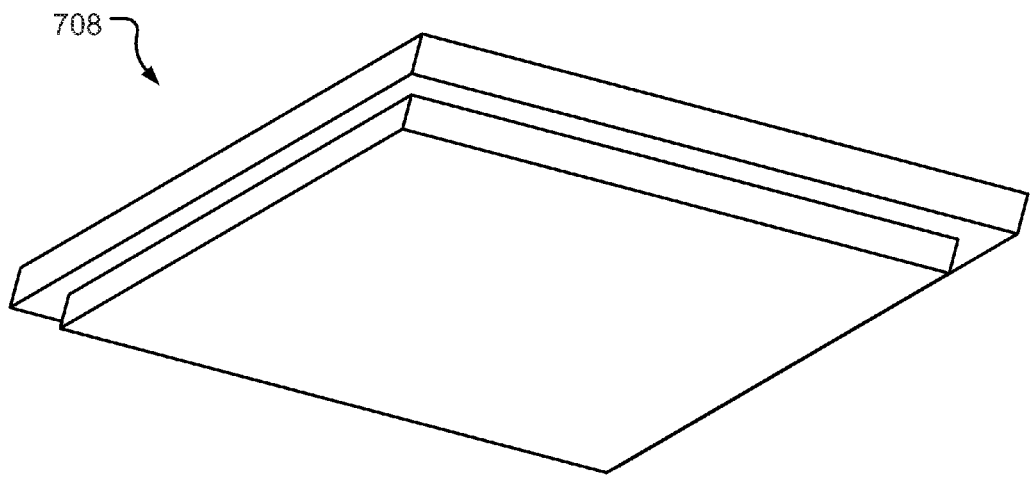
FIG. 8 is a perspective view of the die pad of the related art package of FIG. 7.
Figure 9:
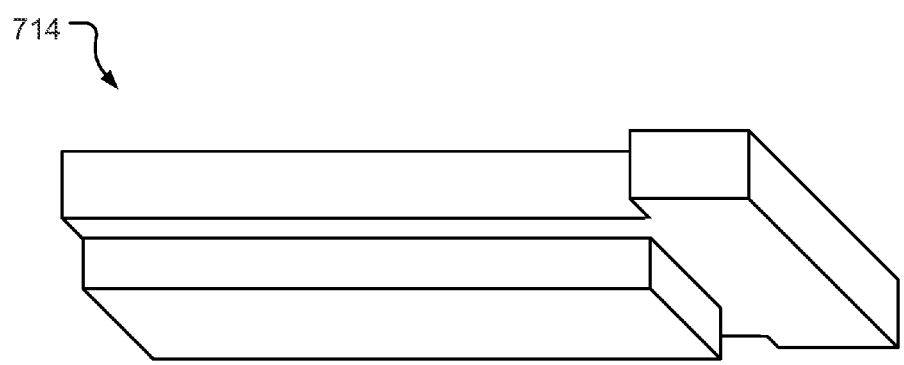
FIG. 9 is a perspective view of a lead of the related art package of FIG. 7.

As illustrated, the package 700 includes a die 710 mounted onto a top surface of a die pad 708 of a substrate 706, a package lid 702 mounted onto a package wall 718, and an air cavity 728 within the package 700. The die pad 708 and leads 714 may be electrically insulated from each other by an insulating material 732. More detailed views of the die pad 708 and one of the leads 714 are illustrated more clearly in FIG. 8 and FIG. 9, respectively. The die pad 708 has a shape such that the bottom surface of the die pad 708 has a smaller surface area than that of the top surface of the die pad 708. In this configuration, when the probe 130 exerts force against the die pad 708, the die pad 708 may lift and separate from the insulating material 732 and leads 714 as shown by the hashed lines. This lift and separation may allow for vapor or fluid leakage through the metal-plastic interfaces, which may cause detrimental performance degradation.

Figure 10:
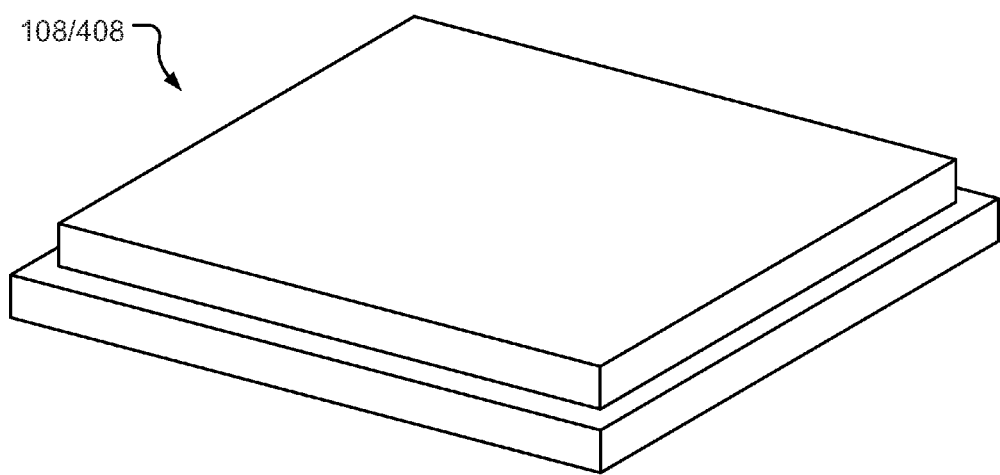
FIG. 10 is a perspective view of a die pad, in accordance with various embodiments.

In contrast, the packages 100, 400 of FIG. 1 and FIG. 4 include a die pad 108, 408 having a pyramid shape, such that the top surface of the die pad 108, 408 has an area that is smaller than an area of the bottom surface, as illustrated in more detail in FIG. 10. In this configuration, when the die pad 108, 408 is tested by the probe 130, the stepped shape of the insulating material 132, 432 can resist against the risk of the probe 130 deforming or delaminating the die pad 108, 408. In addition, there is provided a larger surface area for metal to plastic bond along leads 114, 414 and die pad 108, 408 edges (refer back to FIG. 1 and FIG. 4), which may also reduce the risk of vapor or liquid ingress.

Figure 11:
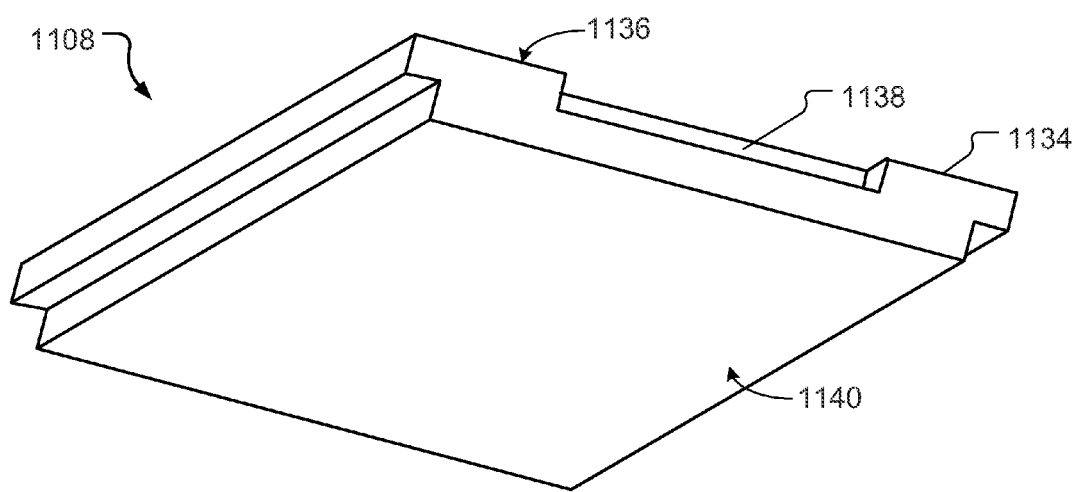
FIG. 11 is a perspective view of another die pad, in accordance with various embodiments.

Rather than having the full pyramid shape, at least one edge 1134 of a top surface 1136 of the die pad 1108 may include an etched portion 1138 such that a width of the top surface 1136 is narrower than a width of the bottom surface 1140, as illustrated in FIG. 11. In this configuration, when the die pad 1108 is tested by a probe, the etched portion 1138 is "locked" in place by the insulating material (for example, insulating material 132 or 432), resisting against the risk of the probe deforming or delaminating the die pad 1138.

Figure 12:
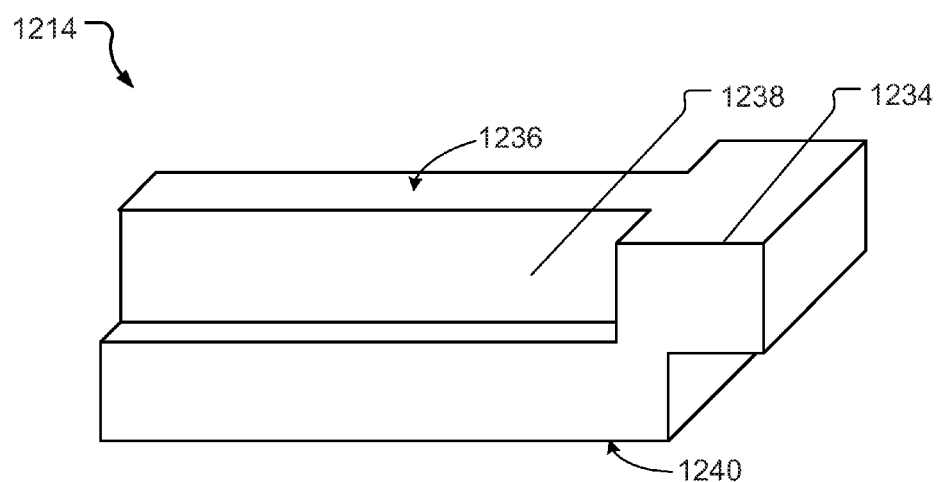
FIG. 12 is a perspective view of another lead, in accordance with various embodiments.

FIG. 12 is a perspective view of another configuration of a lead 1214, in accordance with various embodiments. One or both of the leads 114 or 414 (FIGS. 1 and 4, respectively) may be configured similarly to lead 1214. As illustrated, at least one edge 1234 of a top surface 1236 of the lead 1214 includes an etched portion 1238 such that a width of the top surface 1236 is narrower than a width of the bottom surface 1240. In this configuration, when the lead 1214 is tested by a probe, the etched portion 1238 is "locked" in place by the insulating material (for example, insulating material 132 or 432), resisting against the risk of the probe deforming or delaminating the lead 1214.

Figure 13:
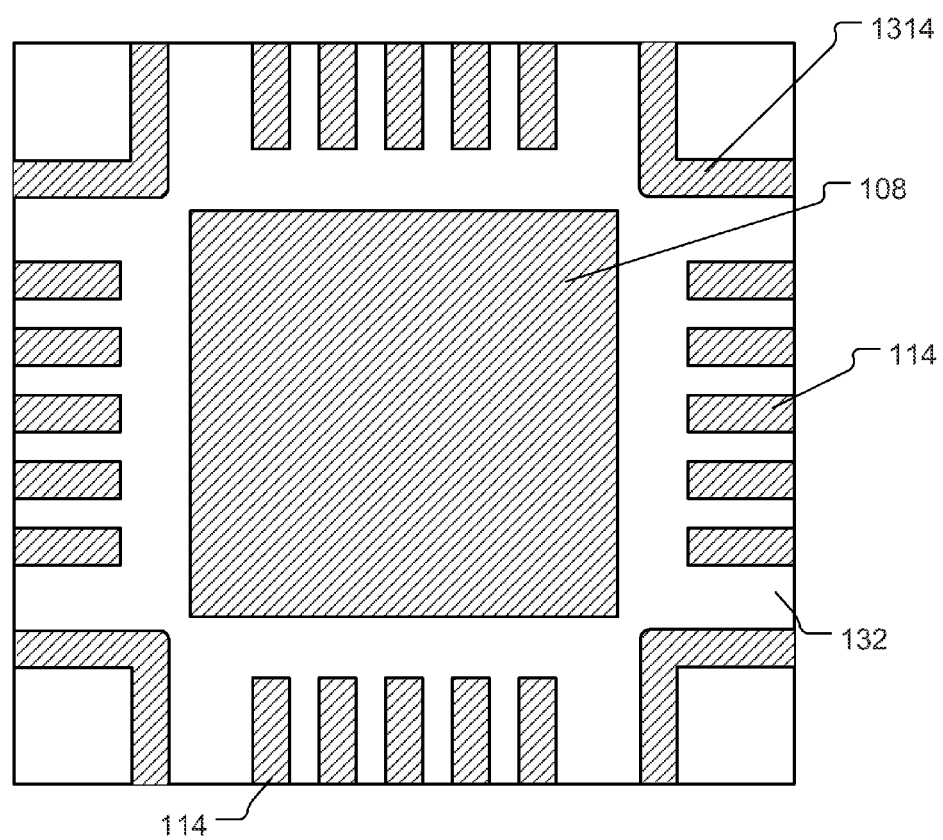
FIG. 13 is a bottom elevation view of a substrate including a pyramid-shaped die pad and L-shaped corner ground leads, all in accordance with various embodiments.

To further reduce the risk of the die pad 108, 408 lifting and separating, one or both of packages 100, 400 may include corner ground leads 1314 configured in an L-shape, as illustrated in FIG. 13. By configuring the leads 1314 in this shape, improved mechanical locking may be provided. Reduced noise and/or additional heat dissipation may also be provided.

Figure 14:
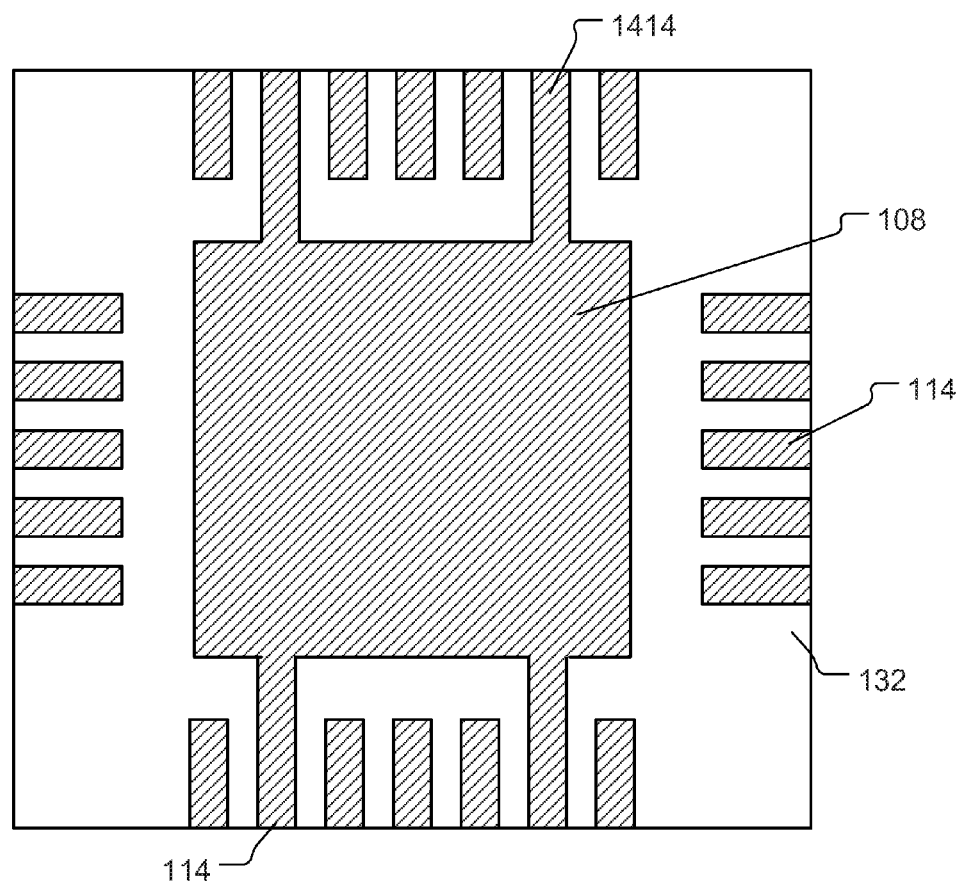
FIG. 14 is a bottom elevation view of a substrate including a pyramid-shaped die pad and a plurality of ground leads coupled to the die pad, all in accordance with various embodiments

FIG. 14 illustrates another embodiment for further reducing the risk of the die pad 108, 408 lifting and separating, one or both of packages 100, 400. As illustrated, a plurality of ground leads 1414 may be connected with the die pad 108. As with the L-shaped leads discussed above, connecting the corner leads 1414 with the die pad 108 may provide improved mechanical locking. Reduced noise and/or additional heat dissipation may also be provided.

Figure 15:
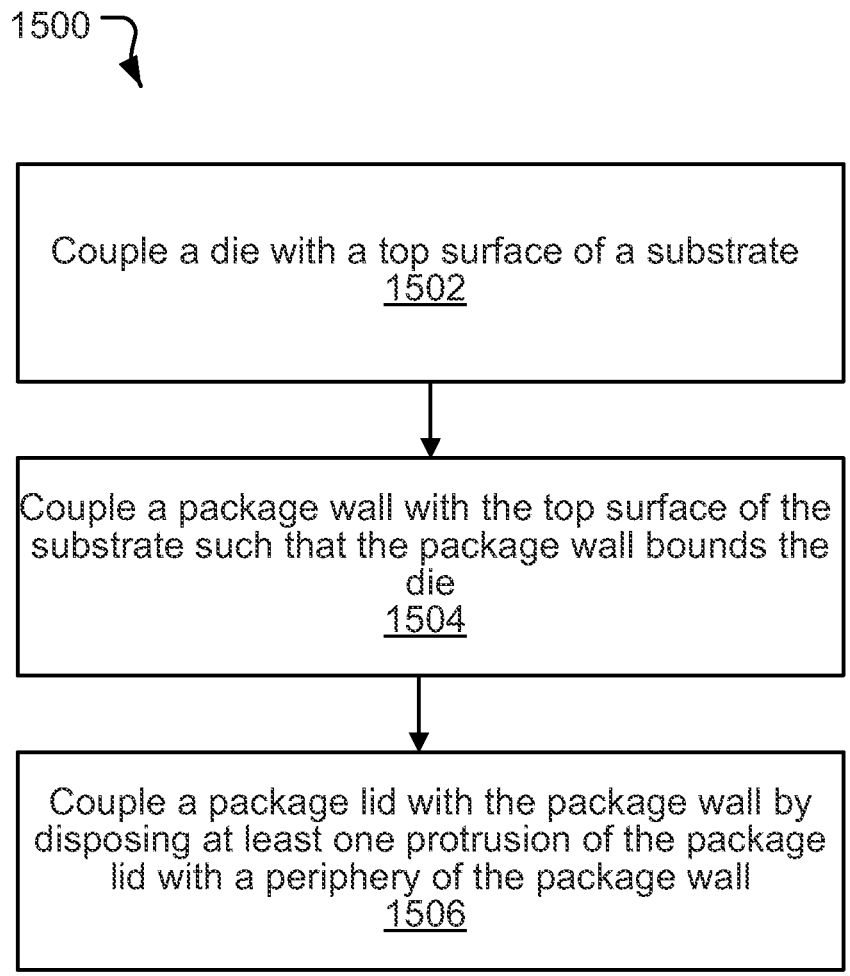
FIG. 15 is a flow diagram of some of the operations associated with a method for making a package including a package lid having at least one protrusion configured to facilitate a coupling of the package lid with a package wall, in accordance with various embodiments.

FIG. 15 illustrates a flow diagram of some of the operations associated with an example method 1500 of making an apparatus including a package wall disposed on a top surface of the substrate and bounding a die, and a package lid coupled with the package wall, and including at least one protrusion configured to facilitate a coupling of the package lid with the package wall, in accordance with various embodiments described herein. The apparatus discussed in reference to FIG. 14 may be similar to one or both of the packages 100, 400 described herein. It should be noted that although the method 1500 is illustrated as a series of sequential steps, the method is not necessarily order dependent. Moreover, methods within the scope of this disclosure may include more or fewer steps than that illustrated in FIG. 15.

Turning now to FIG. 15, the method 1500 may include one or more functions, operations, or actions as is illustrated by block 1502, block 1504, and/or block 1506. Processing for the method 1500 may start with block 1502 by coupling a die with a top surface of a substrate. The substrate may comprise a leadframe. The leadframe may include a die pad and leads in accordance in various embodiments described herein. For example, at least one edge of the top surface of the die pad may include an etched portion such that a width of the top surface is narrower than a width of the bottom surface, and/or at least one edge of a top surface of at least one of the leads includes an etched portion such that a width of the top surface is narrower than a width of the bottom surface.

From block 1502, the method 1500 may proceed to block 1504 by coupling a package wall with the top surface of the substrate such that the package wall bounds the die. The package wall may include one or more tapered walls.

From block 1504, the method 1500 may proceed to block 1506 by coupling a package lid with the package wall by disposing at least one protrusion of the package lid within a periphery of the package wall. Coupling the package lid with the package wall may include coupling the package lid with the package wall using an adhesive material. In various embodiments, the at least one protrusion may be disposed in a center portion of the package lid and defined by a groove disposed along a periphery of the package lid, wherein the coupling the package lid with the package wall comprising disposing the at least one protrusion within the package wall. In various embodiments, the at least one protrusion may comprise a rib disposed near a periphery of the package lid, wherein the coupling of the package lid with the package wall comprises disposing the rib within the package wall.

Figure 16:
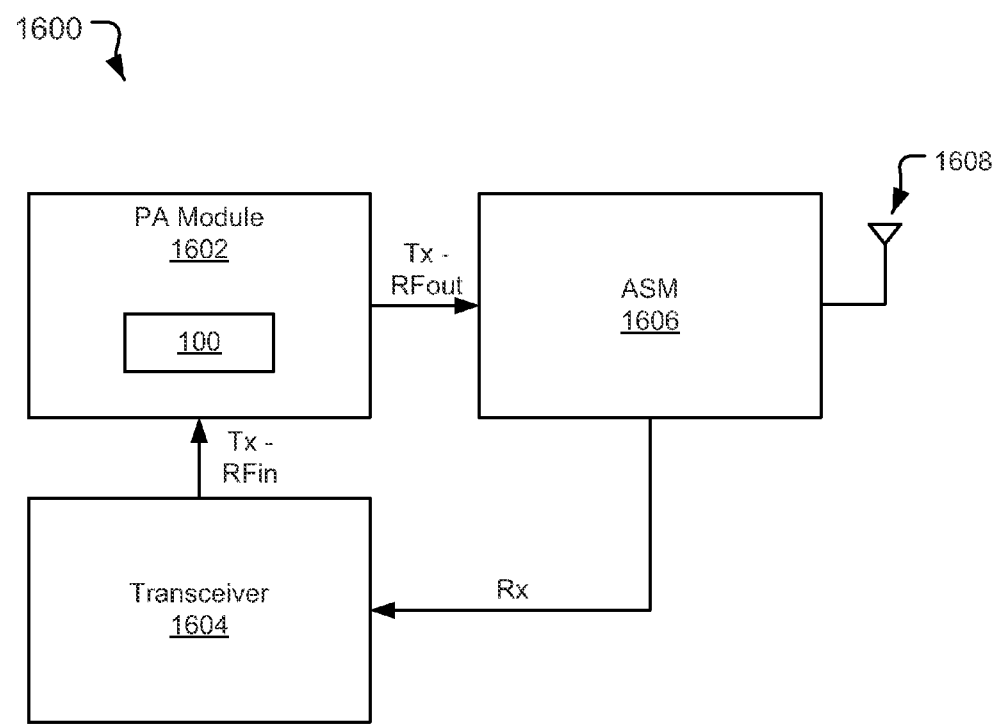
FIG. 16 is a block diagram of a system incorporating a package including a package lid having at least one protrusion for interlocking with a package wall, and a substrate including a pyramid-shaped die pad, in accordance with various embodiments.

Embodiments of packages described herein, and apparatuses including such packages, may be incorporated into various other apparatuses and systems. A block diagram of an example system 1500 is illustrated in FIG. 16. As illustrated, the system 1600 includes an RF power amplifier module 1602. The system 1600 may include a transceiver 1604 coupled with the RF power amplifier module 1602 as illustrated.

The power amplifier module 1602 may include one or more packages described herein. For example, the power amplifier module 1602 may include one or more of the packages 100, 400 described herein in which a die is coupled with a top surface of the substrate, a package wall is disposed on the top surface of the substrate and bounding the die, and a package lid is coupled with the package wall, and includes at least one protrusion configured to facilitate a coupling of the package lid with the package wall. In various embodiments, at least one edge of the top surface of the die pad may include an etched portion such that a width of the top surface is narrower than a width of the bottom surface, and/or at least one edge of a top surface of at least one of the leads includes an etched portion such that a width of the top surface is narrower than a width of the bottom surface.

The RF power amplifier module 1602 may receive an RF input signal, RFin, from the transceiver 1604. The RF power amplifier module 1604 may amplify the RF input signal, RFin, to provide the RF output signal, RFout. The RF input signal, RFin, and the RF output signal, RFout, may both be part of a transmit chain, respectively noted by Tx-RFin and Tx-RFout in FIG. 16.

The amplified RF output signal, RFout, may be provided to an antenna switch module (ASM) 1606, which effectuates an over-the-air (OTA) transmission of the RF output signal, RFout, via an antenna structure 1608. The ASM 1606 may also receive RF signals via the antenna structure 1608 and couple the received RF signals, Rx, to the transceiver 1604 along a receive chain.

In various embodiments, the antenna structure 1608 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

The system 1600 may be any system including power amplification. In various embodiments, the system 1600 may be particularly useful for power amplification at high radio frequency power and frequency. For example, the system 1600 may be suitable for any one or more of terrestrial and satellite communications, radar systems, and possibly in various industrial and medical applications. More specifically, in various embodiments, the system 1600 may be a selected one of a radar device, a satellite communication device, a mobile handset, a cellular telephone base station, a broadcast radio, or a television amplifier system.

Although the present disclosure has been described in terms of the above-illustrated embodiments, it will be appreciated by those of ordinary skill in the art that a wide variety of alternate and/or equivalent implementations calculated to achieve the same purposes may be substituted for the embodiments shown and described without departing from the scope of the present disclosure. Those with skill in the art will readily appreciate that embodiments in accordance with the present disclosure may be implemented in a very wide variety of embodiments. This description is intended to be regarded as illustrative instead of restrictive.

What is claimed is:

1. An apparatus comprising:
a die pad having a plurality of edges, a bottom surface, and a top surface, the top surface configured to couple with a die;
and
a plurality of leads disposed around a periphery of the die pad;
wherein at least a first edge of the plurality of edges of the die pad includes an etched portion of the top surface of the die pad such that a first dimension of the top surface at the etched portion is narrower than a corresponding first dimension of the bottom surface; and
wherein at least a second edge of the plurality of edges of the die pad includes a recessed portion of the bottom surface such that a second dimension of the top surface of the die pad is wider than a corresponding second dimension of the bottom surface of the die pad at the recessed portion.

2. The apparatus of claim 1, further comprising an insulating material separating the die pad from the plurality of leads, wherein the insulating material is within the etched portion of the top surface of the die pad.

3. The apparatus of claim 1, wherein the die pad has a pyramid shaped such that the top surface of the die pad has an area that is smaller than an area of the bottom surface.

4. The apparatus of claim 1, wherein at least one of the leads is directly coupled with the die pad.

5. The apparatus of claim 1, wherein at least one of the leads has an L-shape.

6. The apparatus of claim 1, further comprising:
the die coupled with the top surface of the die pad;
a package wall disposed on a top surface of the plurality of leads and bounding the die; and
a package lid coupled with the package wall, and including at least one protrusion configured to interlock the package lid with the package wall.

7. The apparatus of claim 6, wherein the package lid and the package wall define an air cavity, and wherein the die is disposed within the air cavity.

8. The apparatus of claim 1, wherein the apparatus is a substrate, and further comprising:
the die coupled with the top surface of the die pad.

9. An apparatus comprising:
a die pad configured to couple with a die; and
a plurality of leads disposed around a periphery of the die pad, each lead in the plurality of leads comprising a plurality of edges;
wherein a first edge of a lead in the plurality of leads comprises an etched portion in a top surface of the lead such that a first dimension of the top surface of the lead is narrower at the etched portion than a corresponding first dimension of a bottom surface of the lead; and
wherein a second edge of the lead in the plurality of leads includes a recessed portion in the bottom surface such that a second dimension of the top surface of the lead is wider than a corresponding second dimension of the bottom surface of the lead at the recessed portion.

10. The apparatus of claim 9, further comprising an insulating material separating the die pad from the plurality of leads, wherein the insulating material is within the etched portion of the top surface of the at least one of the leads.

11. The apparatus of claim 10, further comprising:
the die coupled with the top surface of the die pad;
a package wall disposed on a top surface of the plurality of leads and bounding the die; and a package lid coupled with the package wall, and including at least one protrusion configured to interlock the package lid with the package wall.

12. The apparatus of claim 9, wherein the apparatus is a substrate, and further comprising:
the die coupled with the die pad.

13. A system comprising:
an antenna switch module configured to receive radio frequency (RF) output signals;
a transceiver coupled with the antenna switch module and configured to generate RF input signals; and
a power amplifier module coupled with the antenna switch module and the transceiver, and configured to receive the RF input signals from the transceiver and to provide RF output signals to the antenna switch module, wherein the power amplifier module includes:
a die pad having a plurality of edges, a bottom surface, and a top surface, the top surface configured to couple with a die; and
a plurality of leads disposed around a periphery of the die pad;
wherein at least a first edge of the plurality of edges of the die pad includes an etched portion in the top surface of the die pad such that a first dimension of the top surface at the etched portion is narrower than a corresponding first dimension of the bottom surface; and
wherein at least a second edge of the plurality of edges of the die pad includes a recessed portion in the bottom surface such that a second dimension of the top surface of the die pad is wider than a corresponding second dimension of the bottom surface of the die pad at the recessed portion.

14. The system of claim 13, further comprising an insulating material separating the die pad from the plurality of leads, wherein the insulating material is within the etched portion of the die pad.

15. The system of claim 13, wherein the die pad has a pyramid shaped such that the top surface of the die pad has an area that is smaller than an area of the bottom surface.

16. The system of claim 13, wherein at least one of the leads is directly coupled with the die pad.

17. The system of claim 13, wherein at least one of the leads has an L-shape.

18. The system of claim 13, further comprising:
the die coupled with the top surface of the die pad;
a package wall disposed on a top surface of the plurality of leads and bounding the die; and
a package lid coupled with the package wall, and including at least one protrusion configured to interlock the package lid with the package wall.

19. The system of claim 18, wherein the package lid and the package wall define an air cavity, and wherein the die is disposed within the air cavity.

20. A system comprising:
an antenna switch module configured to receive radio frequency (RF) output signals;
a transceiver coupled with the antenna switch module and configured to generate RF input signals; and
a power amplifier module coupled with the antenna switch module and the transceiver, and configured to receive the RF input signals from the transceiver and to provide RF output signals to the antenna switch module, wherein the power amplifier module includes:
a die pad configured to couple with a die; and
a plurality of leads disposed around a periphery of the die pad, each lead in the plurality of leads comprising a plurality of edges;
wherein a first edge of a lead in the plurality of leads comprises an etched portion in a top surface of the lead such that a first dimension of the top surface of the lead is narrower at the etched portion than a corresponding first dimension of a bottom surface of the lead; and
wherein a second edge of the lead in the plurality of leads includes a recessed portion such that a second dimension of the top surface of the lead is wider than a corresponding second dimension of the bottom surface of the lead at the recessed portion.

21. The system of claim 20, further comprising an insulating material separating the die pad from the plurality of leads, wherein the insulating material is within the etched portion of the top surface of the at least one of the leads.

22. The system of claim 21, further comprising:
the die coupled with the top surface of the die pad;
a package wall disposed on a top surface of the plurality of leads and bounding the die; and
a package lid coupled with the package wall, and including at least one protrusion configured to interlock the package lid with the package wall.

\* \* \* \* \*